United States Patent
Yin et al.

(10) Patent No.: US 8,155,902 B2
(45) Date of Patent: Apr. 10, 2012

(54) CONTACTOR STATUS DETECTION IN POWER INVERTERS

(75) Inventors: Jun Yin, Livermore, CA (US); Renjie Xu, Livermore, CA (US)

(73) Assignee: Xantrex Technology Inc., Livermore, CA (US)

(*) Notice: Subject to any disclaimer, the term of this patent is extended or adjusted under 35 U.S.C. 154(b) by 486 days.

(21) Appl. No.: 12/247,534

(22) Filed: Oct. 8, 2008

(65) Prior Publication Data
US 2010/0088052 A1      Apr. 8, 2010

(51) Int. Cl.
| G01R 25/00 | (2006.01) |
| G01R 13/00 | (2006.01) |
| G01R 31/00 | (2006.01) |
| G06F 11/00 | (2006.01) |
| G06F 19/00 | (2011.01) |
| G06F 17/40 | (2006.01) |

(52) U.S. Cl. ..... 702/65; 73/865.8; 73/865.9; 324/76.77; 340/644; 340/645; 340/656; 361/35; 361/85; 700/294; 702/57; 702/182; 702/187; 702/189

(58) Field of Classification Search ............... 73/432.1, 73/865.8, 865.9; 307/149; 324/76.11, 76.77, 324/500, 537; 340/500, 540, 635, 638, 644, 340/645, 646, 653, 679; 361/1, 35, 36, 78, 361/79, 85, 115; 363/178; 700/1, 9, 90, 700/286, 292, 293, 294; 702/1, 33, 34, 57, 702/64, 65, 66, 71, 72, 127, 187, 189
See application file for complete search history.

(56) References Cited

U.S. PATENT DOCUMENTS

| 2,883,255 A | * | 4/1959 | Anderson ........................ 346/34 |
| 3,172,093 A | * | 3/1965 | Diebold ........................ 340/645 |
| 3,321,613 A | * | 5/1967 | Searle ........................... 702/182 |
| 3,678,367 A | * | 7/1972 | McMurray ...................... 363/10 |
| 3,989,999 A | * | 11/1976 | Thompson et al. ........... 323/211 |
| 6,718,271 B1 | * | 4/2004 | Tobin .............................. 702/58 |
| 7,254,004 B2 | * | 8/2007 | Mladenik et al. ............ 361/93.1 |
| 2005/0018371 A1 | * | 1/2005 | Mladenik et al. .............. 361/78 |

FOREIGN PATENT DOCUMENTS

EP      1 074 849 A2 *  2/2001

* cited by examiner

*Primary Examiner* — Edward Cosimano
(74) *Attorney, Agent, or Firm* — Nixon Peabody LLP

(57) ABSTRACT

A sensor-less technique is described for detecting the status of an AC contactor of a power inverter. In one embodiment, a method is provided of sensing an unexpected condition of an AC contactor used to couple to a power distribution system a power inverter having at least one power conductor. The method includes determining a voltage value for the conductor; determining a current value for the conductor; determining a phase difference using the voltage value and the current value; and monitoring successive values of the phase difference to produce a monitoring result. Depending on the monitoring result, a determination is made whether or not to issue an alert signal. Control routines embodying such technique may be stored on computer-readable media. A power inverter using such technique is described.

22 Claims, 7 Drawing Sheets

CONTACTOR STATUS DETECTION IN POWER INVERTERS

FIELD OF THE INVENTION

The present invention relates to power inverters, more particularly to the detection of abnormal conditions in power inverters.

BACKGROUND OF THE INVENTION

In distributed power generation systems, such as solar installations, DC power is generated and converted into AC power for delivery to the power grid. Conversion from DC to AC power is performed by a power inverter. A typical power inverter is computer controlled, using a microprocessor or other suitable system controller. The system controller transitions the inverter between several states such as shut-down, sleep, online and fault-handling states based on the AC and DC voltage and current conditions. AC and DC contactors are used to disconnect the inverter from the AC and DC sources. The AC and DC contactors are controlled by the system controller through Solid State Relays (SSRs).

A fault situation can occur when the AC contactor is unknowingly open but the system controller still commands the power matrix of the power inverter to switch. This situation will cause high and distorted magnetizing current to flow into an isolation transformer of the power inverter, eventually damaging the isolation transformer and the power inverter.

SUMMARY

A sensor-less technique is described for detecting the status of an AC contactor of a power inverter. In one embodiment, a method is provided of sensing an unexpected condition of an AC contactor used to couple to a power distribution system a power inverter having at least one power conductor. The method includes determining a voltage value for the conductor; determining a current value for the conductor; determining a phase difference using the voltage value and the current value; and monitoring successive values of the phase difference to produce a monitoring result. Depending on the monitoring result, a determination is made whether or not to issue an alert signal. Control routines embodying such technique may be stored on computer-readable media. A power inverter using such technique is described.

DETAILED DESCRIPTION

Figure 1:
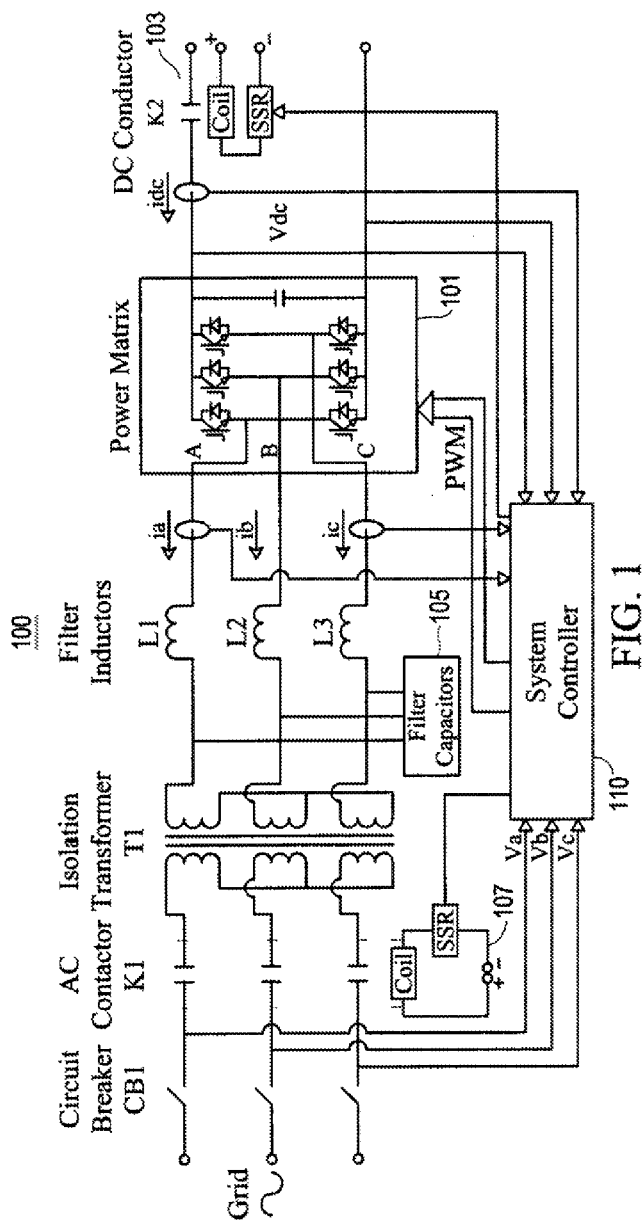
FIG. 1 shows a schematic diagram of a three-phase inverter.

A schematic diagram of a three-phase grid-tie voltage source inverter 100 is shown in FIG. 1. The inverter 100 transforms DC power from photovoltaic (PV) panels or other DC sources to three-phase AC power through a power electronics switching module 101, also called a power matrix. DC power is coupled to the power matrix 101 through a DC contactor K2 having an associated coil and relay combination 103 having an operating voltage applied thereto. When the DC contactor K2 is closed and the power matrix 101 is operating, a DC voltage Vdc is applied to terminals of the power matrix 101, and a DC current idc flows into the power matrix 101.

By a switching action of the power matrix 101, an AC current, such as a three-phase AC current comprising currents ia, ib and ic is produced. The AC current is then filtered through filter inductors L1, L2, L3 and capacitors 105 and isolated by an isolation transformer T1. The three-phase AC current is finally fed to a power distribution grid through an AC contactor K1 and a circuit breaker CB1. The AC contactor K1 has an associated coil and relay combination 107. A system controller 110 inside the inverter performs two major functions: one is the current control and the other is inverter states control and fault protection. In the illustrated embodiment, the system controller 110 receives signals including signals representing the DC voltage Vdc, a signal representing the DC current idc, signals representing the primary-side currents ia and ic, and signals Va, Vb and Vc representing the three-phase AC voltage. In the same embodiment, the system controller 110 produces signals including pulse-width-modulation (PWM) switching signals for the power matrix 101.

The current control function generates current commands, regulates the current through current feedback control, and synchronizes the inverter's current with the grid. (In the illustrated embodiment, only two phase currents ia and ic are needed for the feedback control in a three-phase system without neutral, since the sum of ia, ib and ic is always zero.) A PWM technique is then used to generate switching pulses to control the power matrix 101 to transform the DC power to AC power.

The inverter states control and fault protection function controls the inverter to transition the inverter into various states such as shut-down, sleep, online and fault-handling states based on the AC and DC voltage and current conditions. Controlled by the system controller 110 through the solid state relay (SSR) circuits 103 and 107, the AC and DC contactors K1 and K2 are used to disconnect the inverter from the AC grid and the DC source. A fault situation can occur when the AC contactor K1 is open but the system controller 110 unknowingly still commands the power matrix 101 to switch. This situation will cause high and distorted magnetizing current to flow into the isolation transformer T1, eventually damaging the isolation transformer T1 and the inverter 100.

A sensor-less technique of detecting the status of the AC contactor K1 is now described, as applied for purposes of example to this type of three-phase inverter. The technique applies to inverters of various descriptions, including three-phase grid-tie voltage-source inverters having an isolation transformer inside the inverter, single-phase grid-tie voltage-source inverters, etc.

Figure 2:
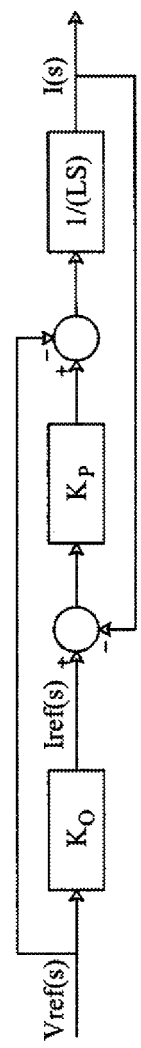
FIG. 2 shows a block diagram of a model of the three-phase inverter during an operational state.

A simplified model of a voltage source inverter with a simple P controller (proportional controller) is shown in FIG. 2. The filter capacitors 105 are ignored because of their smaller impact on the system.

In FIG. 2, the reference voltage Vref is taken from the grid phase voltage and the reference current Iref is synchronized with the Vref or the grid phase voltage. The gain of the P controller is $K_p$. $K_0$ represents the scale factor between the reference voltage Vref and the reference current Iref. The filter inductance is L. The closed-loop system transfer function can be written as:

$$\frac{I(s)}{Vref(s)} = \frac{K_0 K_P - 1}{SL + K_p}. \quad (1)$$

The phase displacement between the fundamental elements of grid phase voltage Vref(s) and the inverter's output current I(s) is dependent on $K_p$ and L. The absolute phase displacement at f (Hz) can be expressed in (2). The absolute phase displacement is tiny because of the very small value of L.

$$\theta = \left|\tan^{-1}\left(\frac{2\pi fL}{K_p}\right)\right| \quad (2)$$

Figure 3:
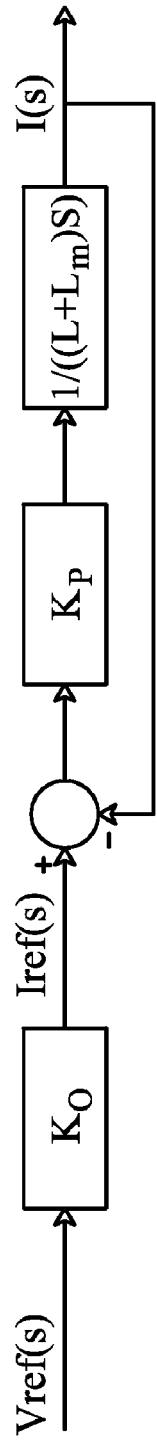
FIG. 3 shows a block diagram of a model of the three-phase inverter during another operational state.

However, when the AC contactor K1 is unknowingly opened and the inverter 100 continuously powers the isolation transformer T1, the system model changes to that shown in FIG. 3. The closed-loop transfer function of this system can be written as:

$$\frac{I(s)}{Vref(s)} = \frac{K_0 K_P}{S(L + L_m) + K_p} \quad (3)$$

where, $L_m$ is the magnetizing inductance of the isolation transformer.

The phase displacement between the fundamental elements of grid phase voltage and the inverter's output current is dependent of $K_p$ and $L+L_m$. The absolute value of the phase displacement now can be expressed as:

$$\theta = \left|\tan^{-1}\left(\frac{2\pi f(L+L_m)}{K_p}\right)\right| \quad (4)$$

A significant absolute value increase in the phase displacement can be expected with the open condition of the AC contactor since the magnetizing inductance of the transformer, $L_m$, is far greater than the filter inductance, L.

In one implementation, detection of the open condition is achieved using phase detection in a well-known α-β frame; in particular, the voltage-current phase angle, which as shown above exhibits a strong dependence on the open or closed state of the AC contactor, is detected. A well-known stationary frame transformation ("α-β frame transformation") is used to transform the variables in the three-phase frame to the α-β frame, as expressed mathematically for example in (5):

$$\begin{bmatrix} V_\alpha \\ V_\beta \\ V_0 \end{bmatrix} = \frac{2}{3} \begin{bmatrix} 1 & -1/2 & -1/2 \\ 0 & \sqrt{3}/2 & -\sqrt{3}/2 \\ 1/2 & 1/2 & 1/2 \end{bmatrix} \begin{bmatrix} V_a \\ V_b \\ V_c \end{bmatrix}. \quad (5)$$

Figure 4:
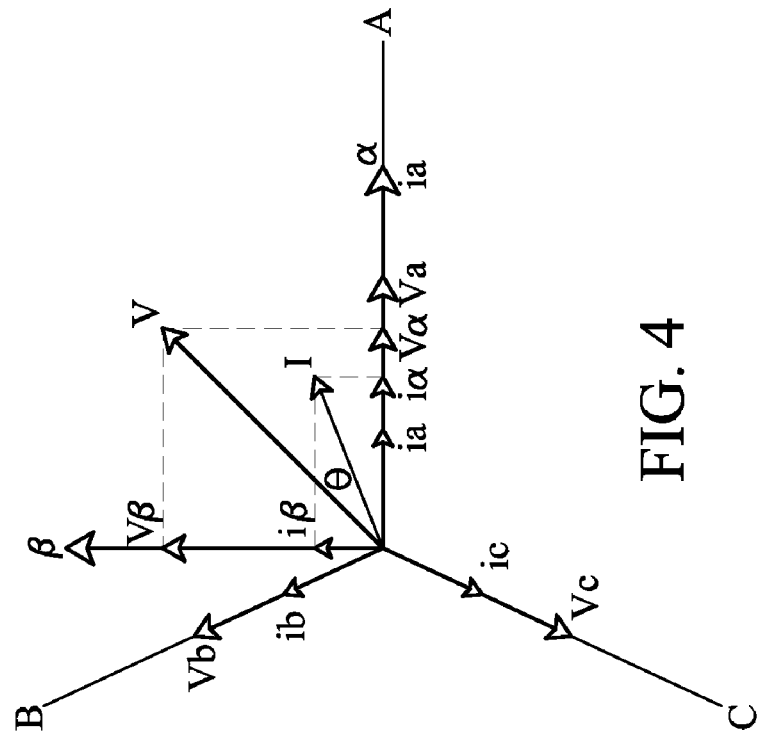
FIG. 4 shows an illustration of a known α-β frame transformation.

In a symmetrical three-phase system, $V_0$ is zero. Therefore the three-phase variables such as voltage (Va, Vb and Vc) and current (ia, ib and ic) can be expressed by vectors V and I respectively in the α-β frame as shown in FIG. 4. The angle between vectors V and I is also the angle θ between the phase voltage and phase current in a symmetrical three-phase system.

Since the angle between vector V and I is the angle of the product of the voltage vector V and the conjugate of the current vector I* in the complex plane, there results:

$$VI^* = (V_\alpha + jV_\beta) \cdot (I_\alpha - jI_\beta). \quad (6)$$

The absolute value of the angle of the VI* can be expressed as in (7):

$$\theta = |\tan^{-1}\{(V_\beta I_\alpha - V_\alpha I_\beta)/(V_\alpha I_\alpha + V_\beta I_\beta)\}|. \quad (7)$$

Figure 5:
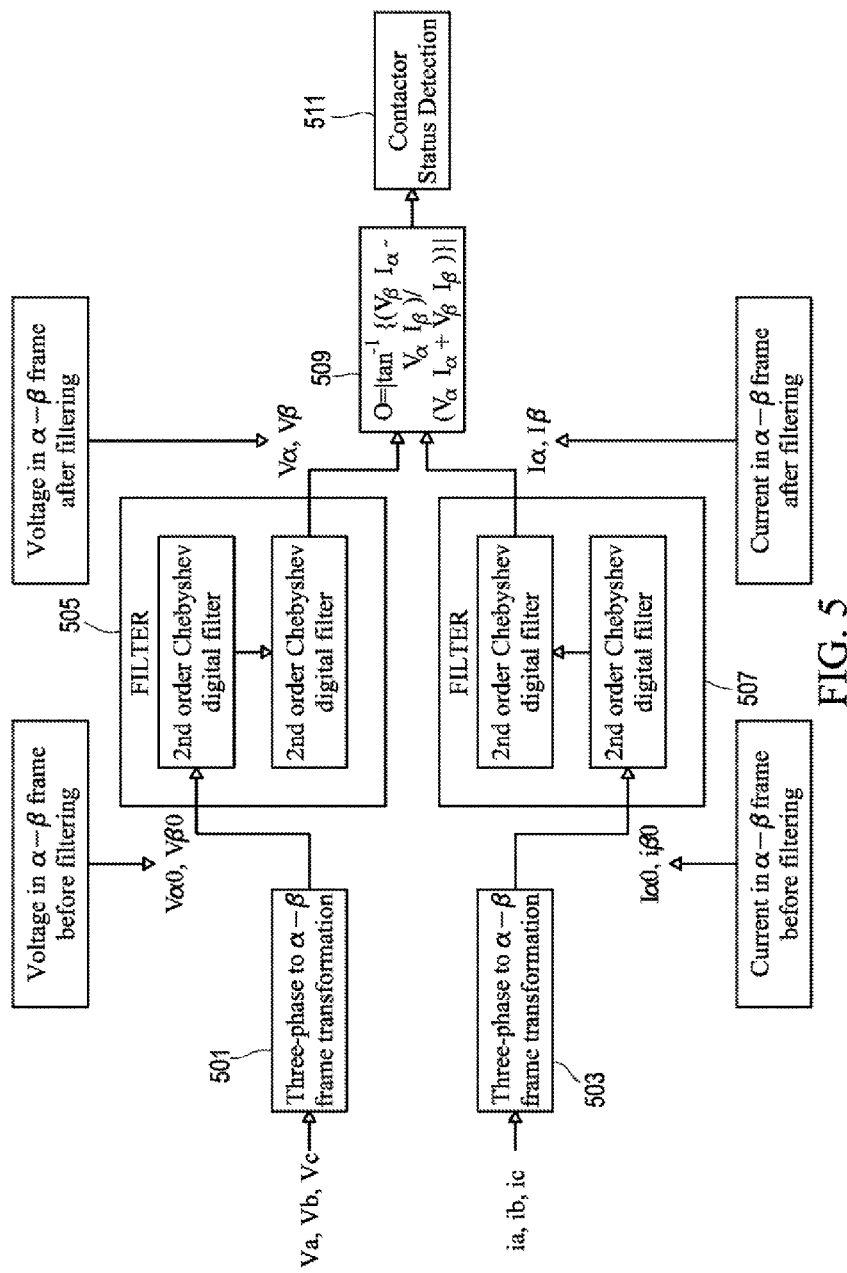
FIG. 5 shows a process for computation of the phase displacement between the voltage and current of the three-phase inverter of FIG. 1.

In an exemplary embodiment, the system controller 110 performs an algorithm for real-time angle detection and AC contractor status detection based thereon. A diagram of this exemplary algorithm is shown in FIG. 5. To realize a real-time angle detection, voltages Va, Vb, Vc and currents ia, ib, ic are first transformed to the α-β frame (501, 503). Digital filtering is then applied to both the voltage (505) and current (507) in the α-β frame. In the case of voltage, voltage values Vα0 and Vβ0 are input to the digital filter 505, which outputs filtered voltage values Vα and Vβ. In the case of current, current values Iα0 and Iβ0 are input to the digital filter 507, which outputs filtered current values Iα and Iβ. The phase displacement θ between the voltage vector and current vector is then obtained through the conjugate complex computation (509) as described in (7). Based on the resulting phase displacement values, contactor status detection (511) is then performed.

In an exemplary embodiment, a dual second order Chebyshev filter is used as the filter 505 and as the filter 507. Two second order Chebyshev digital filters are cascaded to obtain the desired fundamental components of voltage and current. The coefficients of the Chebyshev filter are shown in Appendix 1. Any of various other suitable filter arrangements may be used for this purpose.

In the embodiment of FIG. 5, to make the real time detection stable, the average of absolute phase displacement in one second is taken as the index for the detection of an AC contactor open condition in block 511. If the number of abnormally high index values in twelve seconds is greater than seven, then a fault signal will be sent out to shut down the inverter.

Figure 6:
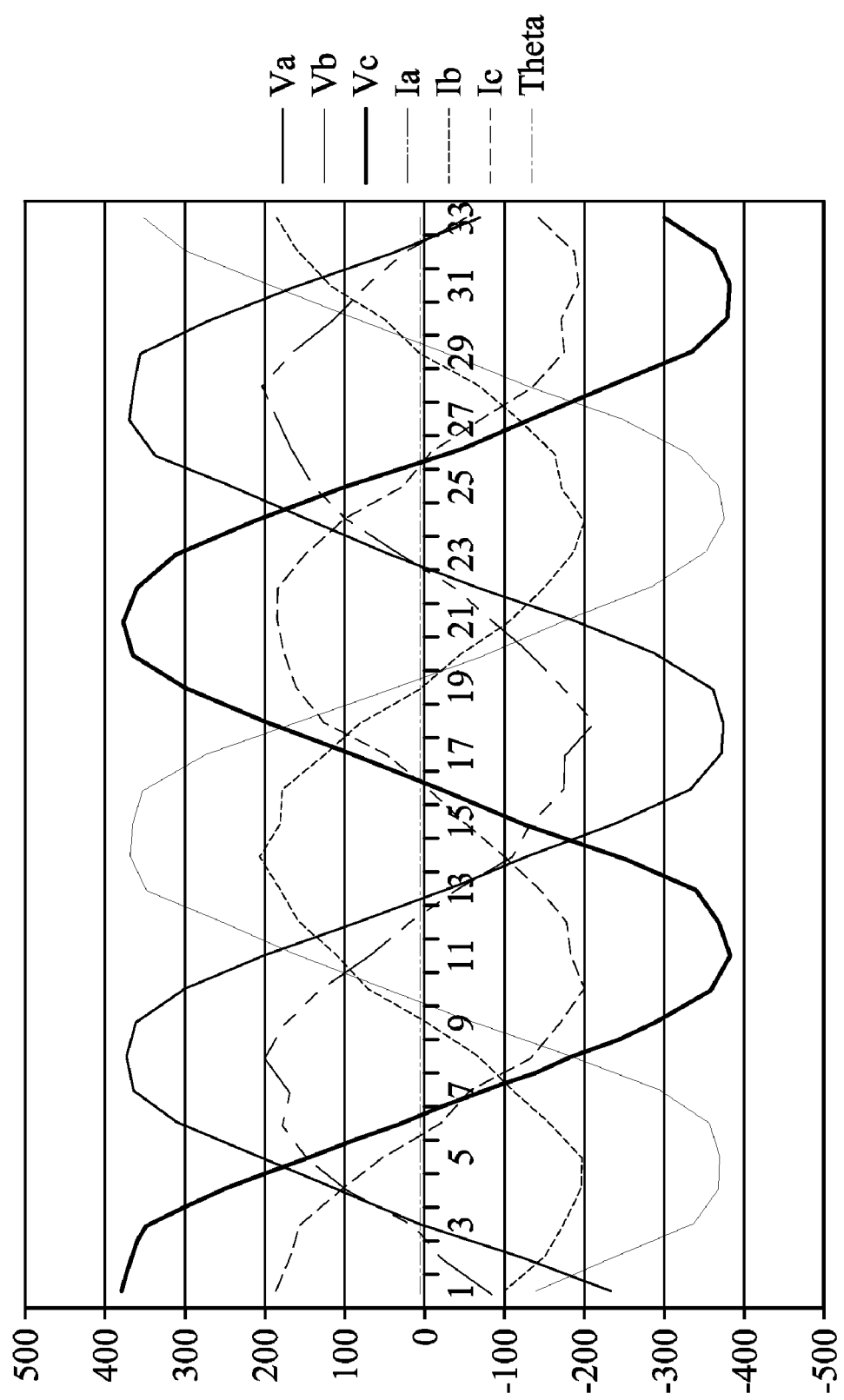
FIG. 6 shows a plot of voltage, current and phase displacement during a normal condition.
Figure 7:
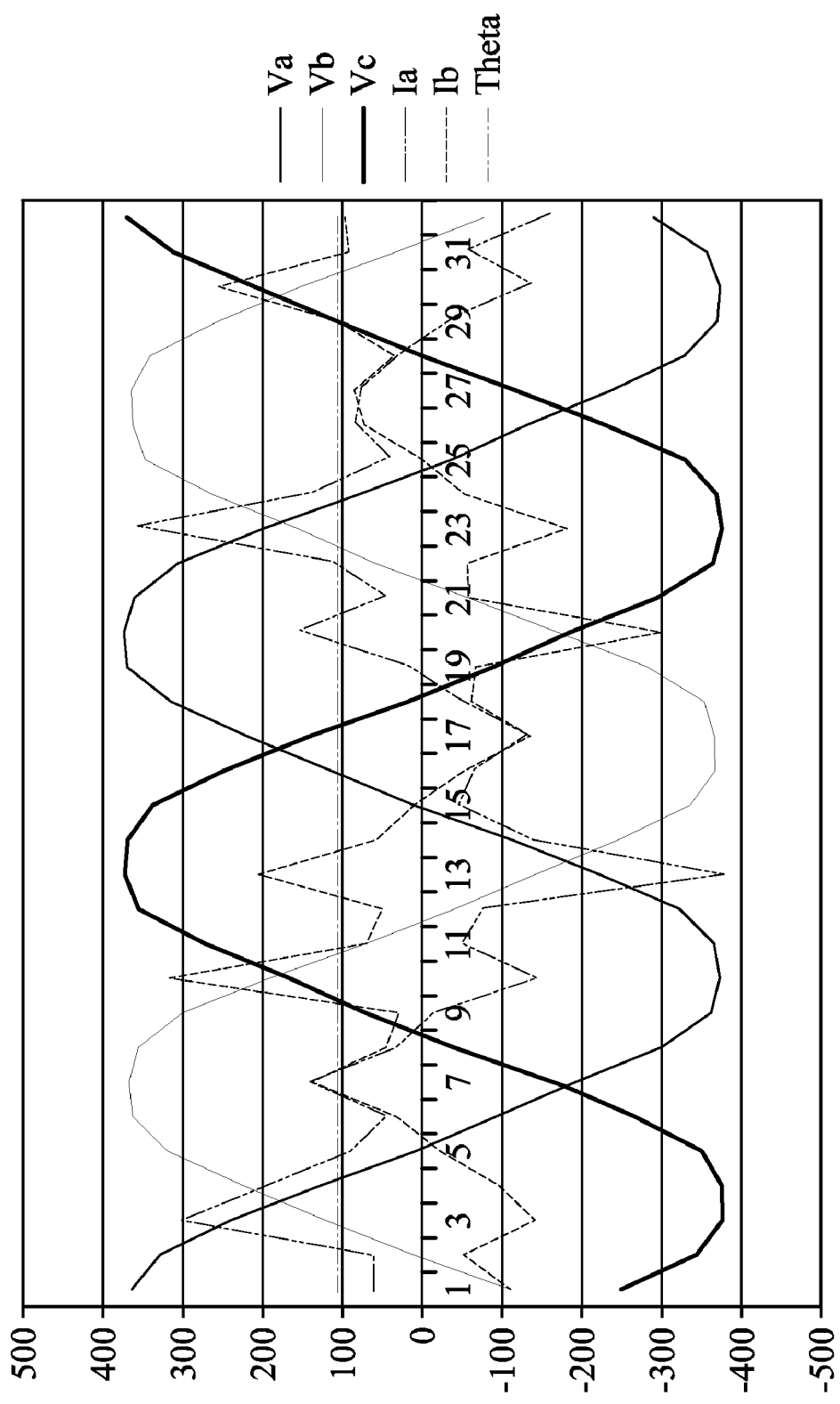
FIG. 7 shows a plot of voltage, current and phase displacement during an abnormal condition.

FIG. 6 and FIG. 7 illustrate application of the foregoing detection technique. FIG. 6 shows three-phase voltage, three-phase current, and phase displacement of voltage and current in a three-phase grid-tie voltage-source inverter with the inverter was running normally. The average of the phase displacement of fundamental voltage and current in this normal situation is stable at about 0.07 radians. (Note: The average of the absolute phase displacement has been scaled (×100) in FIGS. 6 and 7.)

Figure 8:
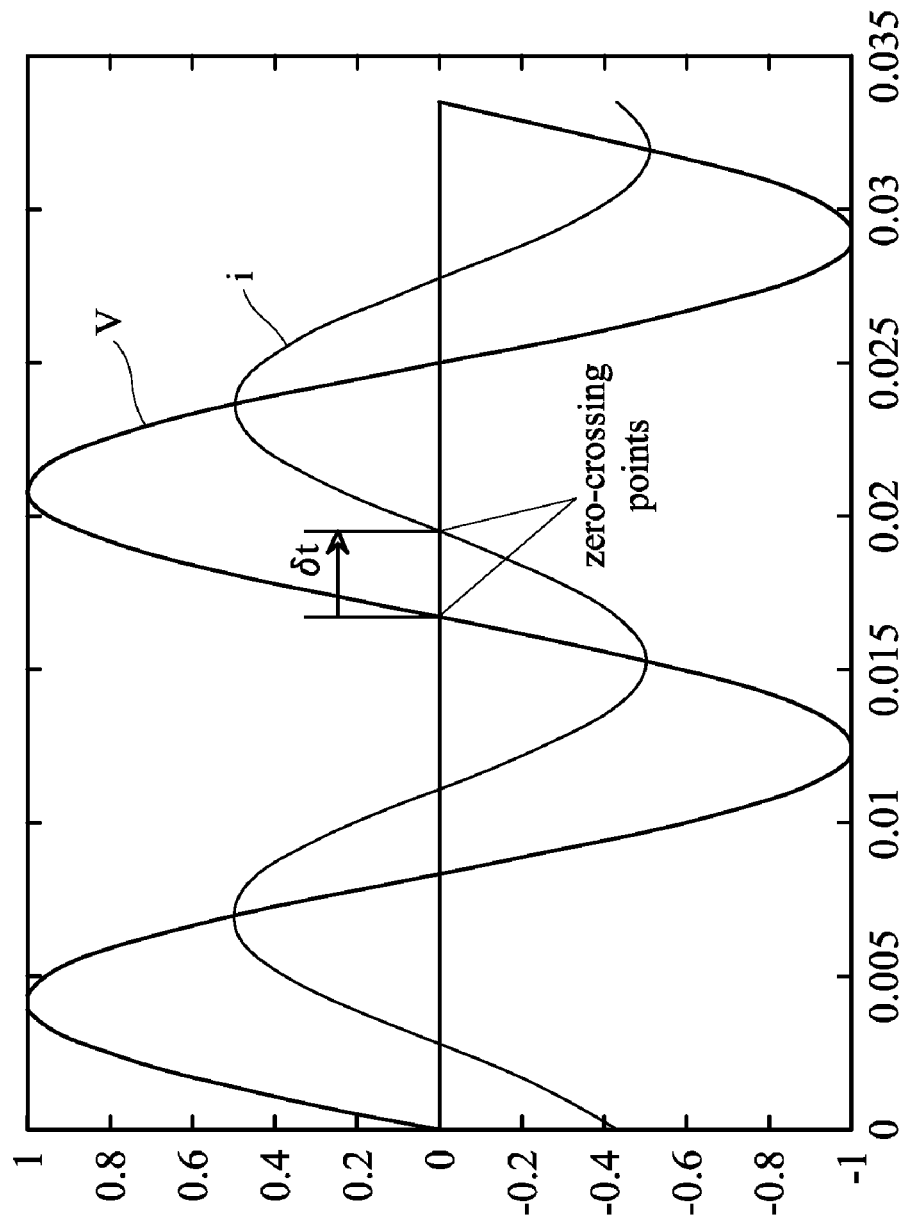
FIG. 8 shows voltage and current waveform zero crossings in a detection method for single-phase inverters.

In the case of a single-phase inverter, to measure the phase angle between the AC voltage (v) and the AC current (i) after filtering, the time span (δt) between voltage and current zero-crossing points (usually crossing from negative to positive) can be detected as shown in FIG. 8. Theoretically, the phase angle can be calculated in radians as follows:

$$\theta = 2\pi f \delta t \quad (8)$$

where, f is the frequency of voltage and current.

With the phase angle being averaged over one second (60 AC cycles), sufficient stable and accurate phase angles for discerning the status of the AC contactor can be obtained, since the difference in phase angles is very large when the contactor is close or unknowingly open.

FIG. 7 shows the three-phase voltage, current and the phase displacement after the AC contactor has opened. The phase displacement of the fundamental voltage and current has increased to 1.05 radians and is stable at this value. In a field test, a threshold of 0.55 radians was set for the inverter to detect the fault. The inverter tripped the fault in about 20 sec as designed.

Figure 9:
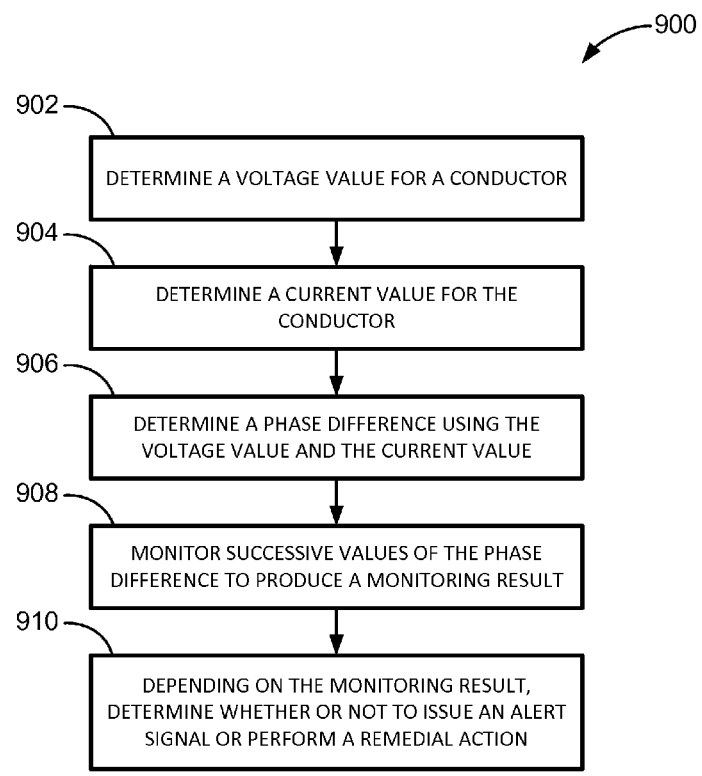
FIG. 9 shows a block diagram of a process for sensing an unexpected condition of an AC contactor used to couple to a power distribution system a power inverter having a power conductor.

FIG. 9 shows a process 900 for sensing an unexpected condition of an AC contactor used to couple to a power distribution system a power inverter having a power conductor. The process 900 includes determining a voltage value for the conductor (902). The process 900 includes determining a current value for the conductor (904). The process 900 includes determining a phase difference using the voltage value and the current value (906). The process 900 includes monitoring successive values of the phase difference to produce a monitoring result (908). The process includes, depending on the monitoring result, determining whether or not to issue an alert signal or perform a remedial action (910).

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

APPENDIX 1

The second order Chebyshev digital filter $$H(z) = \frac{a_0 + a_1 z^{-1} + a_2 z^{-2}}{b_1 z^{-1} + b_2 z^{-2}} \quad (8)$$

$a_0 = 0.0004848$
$a_1 = 0.0009696$
$a_2 = 0.0004848$
$b_1 = -1.9576$
$b_2 = 0.9603$

What is claimed is:

1. A method of sensing an unexpected condition of an AC contactor used to couple to a power distribution system a power inverter having at least one power conductor, comprising:
   determining a voltage value for said at least one conductor;
   determining a current value for said at least one conductor;
   determining a phase difference using the voltage value and the current value;
   monitoring a plurality of successive values of the phase difference to produce a monitoring result; and
   depending on the monitoring result, determining whether or not to issue an alert signal or perform a remedial action.

2. The method of claim 1, wherein monitoring comprises comparing values of the phase difference to a threshold value.

3. The method of claim 2, comprising producing one monitoring result when at least a majority of N successive values of the phase difference are greater than the threshold value, and producing a different monitoring result otherwise.

4. The method of claim 3, wherein the power inverter is a three phase power inverter, and wherein determining a voltage value comprises:
   obtaining voltage values for voltages of each phase of the three phase power inverter; and
   transforming the voltage values to an α-β frame to obtain a voltage value in the α-β frame.

5. The method of claim 4, wherein determining a current value comprises:
   obtaining current values for currents of at least two of the three phase power inverter; and
   transforming the current values to an α-β frame to obtain a current value in the α-β frame.

6. The method of claim 5, wherein determining a phase difference comprises determining a phase difference between the voltage value in the α-β frame and the current value in the α-β frame.

7. The method of claim 6, wherein determining a phase difference comprises filtering the voltage value in the α-β frame and filtering the current value in the α-β frame.

8. A non-transitory computer readable medium including program instructions for sensing an unexpected condition of an AC contactor used to couple to a power distribution system a power inverter having at least one power conductor, said instructions, when executed by a controller, performing steps comprising:
   determining a voltage value for said at least one conductor;
   determining a current value for said at least one conductor;
   determining a phase difference using the voltage value and the current value;
   monitoring a plurality of successive values of the phase difference to produce a monitoring result; and
   depending on the monitoring result, determining whether or not to issue an alert signal or perform a remedial action.

9. The computer readable medium of claim 8, wherein monitoring comprises comparing values of the phase difference to a threshold value.

10. The computer readable medium of claim 9, comprising producing one monitoring result when at least a majority of N successive values of the phase difference are greater than the threshold value, and producing a different monitoring result otherwise.

11. The computer readable medium of claim 10, wherein the power inverter is a three phase power inverter, and wherein determining a voltage value comprises:
   obtaining voltage values for voltages of each phase of the three phase power inverter; and
   transforming the voltage values to an α-β frame to obtain a voltage value in the α-β frame.

12. The computer readable medium of claim 11, wherein determining a current value comprises:
   obtaining current values for currents of at least two of the three phase power inverter; and
   transforming the current values to an α-β frame to obtain a current value in the α-β frame.

13. The computer readable medium of claim 12, wherein determining a phase difference comprises determining a phase difference between the voltage value in the α-β frame and the current value in the α-β frame.

14. The computer readable medium of claim 13, wherein determining a phase difference comprises filtering the voltage value in the α-β frame and filtering the current value in the α-β frame.

15. A power inverter comprising:
an arrangement of power switches;
at least one power conductor coupled to the arrangement of power switches;
a transformer coupled to the at least one power conductor and having a primary side coupled to an AC grid and a secondary side coupled to a DC source; and
an AC contactor coupled to the transformer and used to couple the power inverter to a power distribution system;
a measuring device coupled to the at least one power conductor;
an input on the primary side of the transformer; and
a controller coupled to the measuring device and the input, and coupled to the arrangement of power switches to control switching of the power switches, wherein the controller is configured to:
    determine a current value and a voltage value from the measuring device and the input for the at least one conductor, and
    use the current value and the voltage value to sense an unexpected condition of the AC contactor.

16. The apparatus of claim 15, wherein the controller is configured to:
determine a phase difference using the voltage value and the current value;
monitor a plurality of successive values of the phase difference to produce a monitoring result; and
depending on the monitoring result, determine whether or not to issue an alert signal or perform a remedial action.

17. The apparatus of claim 16, wherein the controller is configured to compare values of the phase difference to a threshold value.

18. The apparatus of claim 17, wherein the controller is configured to produce one monitoring result when at least a majority of N successive values of the phase difference are greater than the threshold value, and to produce a different monitoring result otherwise.

19. The apparatus of claim 18, wherein the power inverter is a three phase power inverter, and wherein the controller is configured to:
obtain voltage values for voltages of each phase of the three phase power inverter; and
transform the voltage values to an α-β frame to obtain a voltage value in the α-β frame.

20. The apparatus of claim 19, wherein the controller is configured to:
obtain current values for currents of at least two of the three phase power inverter; and
transform the current values to an α-β frame to obtain a current value in the α-β frame.

21. The apparatus of claim 20, wherein the controller is configured to determine a phase difference between the voltage value in the α-β frame and the current value in the α-β frame.

22. The apparatus of claim 21, wherein the controller is configured to filter the voltage value in the α-β frame and filter the current value in the α-β frame.

* * * * *